(12) United States Patent
Iba et al.

(10) Patent No.: US 6,998,336 B1
(45) Date of Patent: Feb. 14, 2006

(54) WIRING BOARD AND METHOD OF PRODUCING THE SAME

(75) Inventors: Masahiro Iba, Iwakura (JP); Hajime Sakai, Aichi (JP); Takahiro Hayashi, Komaki (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 11/070,200

(22) Filed: Mar. 3, 2005

(30) Foreign Application Priority Data

Nov. 17, 2004 (JP) .............................. 2004-333338
Dec. 10, 2004 (JP) .............................. 2004-358708

(51) Int. Cl.
*H01L 21/44* (2006.01)
(52) U.S. Cl. ...................................... 438/612; 257/772
(58) Field of Classification Search ........ 438/612–614; 257/772, 779
See application file for complete search history.

(56) References Cited

U.S. PATENT DOCUMENTS 5,953,623 A * 9/1999 Boyko et al. ............... 438/612

FOREIGN PATENT DOCUMENTS

JP          10-112514          4/1998

OTHER PUBLICATIONS

Takao et al; "Development of Highly Reliable Sn-Ag Lead-Free Solder Alloy"; R&D, vol. 35, No. 2, Jun., 2000, Abstract.

* cited by examiner

*Primary Examiner*—David Nelms
*Assistant Examiner*—Quoc Hoang
(74) *Attorney, Agent, or Firm*—Stites & Harbison PLLC; Ross F. Hunt, Jr.

(57) ABSTRACT

A method of producing a wiring board includes a preliminary plating step of forming a solder resist layer such that the main layer of each metal pad of the board is exposed in each corresponding opening and covering the surface of the exposed main layer with a preliminary Sn plated layer. A solder paste application step involves applying a solder paste, containing solder powder comprised of the high temperature Sn solder and thicker than the preliminary Sn plated layer, on the preliminary Sn plated layer. A subsequent solder melting step involves forming the Sn solder covering layer by melting the solder paste layer together with the preliminary Sn plated layer by heating the solder paste layer to a temperature higher than the liquid phase line temperature of the high temperature Sn solder. This wettingly extends the melted layers over the surface of the main layer.

13 Claims, 5 Drawing Sheets

Step 1

Step 2

Step 3

WIRING BOARD AND METHOD OF PRODUCING THE SAME

BACKGROUND OF THE INVENTION

1. Field of the Invention

The present invention relates to wiring boards and methods of producing the same.

2. Description of the Related Art

In organic packages arranged to employ ball grid arrays (hereinafter, abbreviated as BGAs), as a precondition, solder connecting portions acting as the BGAs are formed from solder balls (see, e.g., Japanese Patent Application Laid-Open Publication No. 10-112514 and "Development of Highly Reliable Sn—Ag Lead Free Solder" Toyota Central R&D and Labs., Inc. R&D Review, Vol. 35 No. 2 (2000), p39). Ordinarily, a solder connecting portion of a BGA is formed by placing a solder ball on a copper (Cu) pad formed on a board and using reflowing to form the connecting portion. Heretofore, a high temperature solder having a high Pb content has been used as a solder ball member. Since the high temperature solder has a high reflow temperature and is inferior in wettability with the Cu pad as compared with an eutectic solder, a faulty connection can occur in the high temperature solder (see, e.g., the above-mentioned patent and publication). Although the above-mentioned patent discloses stereotypical technology for improving wettability by applying a paste on the Cu pad, the result is not completely satisfactory. On the other hand, in another approach, a connection assistant solder layer is previously formed on the Cu pad by applying an eutectic solder paste on the Cu pad and then melting the paste. This approach can be expected to enhance the connecting strength of a solder ball by previously forming the eutectic solder layer having good wettability on the Cu pad.

More recently, so-called Pb free solder, i.e., a solder which does not contain Pb, is being used in place of the conventional Sn—Pb eutectic solder because of environmental pollution problems associated with the latter. The Pb free solder has a high reflow temperature and has poor wettability with the Cu pad. Accordingly, even if it is intended to form the connection assistant solder layer by melting, a problem arises in that the solder does not wettingly cover a pad surface well, and does not provide a good electrical connection because a large exposed area remains. Further, since quite a large amount of a free Pb solder swells high on the pad without wettingly covering the pad, when a solder ball is placed on the pad for mounting thereon, the ball becomes unstable on the pad. As a consequence, the ball positioning accuracy is poor. Moreover, when the amount of a solder paste to be applied is increased in an attempt to reduce the exposed area on the pad, the problem is exacerbated.

SUMMARY OF THE INVENTION

An object of the present invention is to provide a method of producing a wiring board that can uniformly cover a Cu pad surface, even though a high temperature Sn solder having a low Pb content is used, and, further, to provide a wiring board that is produced by this method.

To solve the above-mentioned problems, in accordance with one aspect of the invention, there is provided a method of producing a wiring board including a wiring laminated layer portion having a dielectric layer comprised of a polymer material and an alternately laminated conductive layer, a plurality of metal pads disposed on a major surface of the dielectric layer of the wiring laminated layer portion, and a solder resist layer disposed on the major surface formed of the wiring laminated layer portion and having openings for exposing the metal pads, each of the metal pads including a main layer comprised of a Cu plated layer, and an Sn solder covering layer comprised of a high temperature Sn solder principally comprised of Sn and having a liquid phase line temperature of between about 185° C. and 232° C., the Sn solder covering layer covering the surface of the main layer located in each of the openings of the solder resist layer at an area covering ratio of at least 81% so as to be in contact with the main layer, and having a protuberant surface having a maximum thickness at a central position of the opening and a minimum thickness at an inner peripheral edge position thereof, and the thickness of the protuberant surface at the central position thereof being smaller than the depth of the corresponding opening. The method of producing the wiring board includes a preliminary plating step of forming the solder resist layer such that the main layer of each metal pad is exposed in a corresponding opening and covering the exposed surface of the main layer with a preliminary Sn plated layer, a solder paste application step of applying a solder paste, which contains solder powder comprised of the high temperature Sn solder, and thicker than the preliminary Sn plated layer, on the preliminary Sn plated layer, and a solder melting step of forming the Sn solder covering layer by melting the applied solder paste layer, together with the preliminary Sn plated layer, by heating the solder paste applied layer to a temperature higher than the liquid phase line temperature of the high temperature Sn solder, and thereby wettingly extending the Sn solder covering layer over the surface of the main layer, with these steps being executed in the order recited.

It is noted that Sn—Pb eutectic solder ordinarily used in making wiring boards often has an eutectic composition of Sn-38 wt % Pb and a melting point of 183° C. Even if the composition shifts to a Pb rich side or to a Sn rich side from the above stated composition, the melting point (liquid phase line) of the alloy increases. Although a simple Sn metal corresponds to the metal obtained by simply eliminating all of the Pb from the eutectic solder, the resultant metal has a melting point of 232° C. In the high temperature Sn solder employed in some preferred embodiments of the present invention, the phrase "using Sn as a main component" means that at least 62 wt % of Sn is contained in the eutectic solder. Setting the melting point of the solder to at least 185° C. requires use of a solder of an Sn alloy obtained by reducing a Pb content of the Sn—Pb eutectic solder (and this results in an upper limit melting point of 232° C. which is the melting point of the simple Sn metal). It is preferable from an environmental conservation viewpoint that the Pb content of the Sn alloy constituting the high temperature solder be no greater than 5 wt % and, more preferably, 1 wt % or less, and it is furthermore preferable that the Pb content be as small as possible except for the Pb inevitably contained in impurities.

According to the method of producing the wiring board of the present invention, the Sn solder covering layer comprised of the high temperature Sn solder is formed on the surface of the main layer of each pad comprised of the Cu plated layer and exposed to the solder resist layer. At this time, the solder paste comprised of the high temperature Sn solder is not directly applied to the surface of the main layer of the pad, i.e., the preliminarily Sn plated layer is thinly formed on the surface of the main layer before the solder paste is applied, and then the solder paste is applied on the preliminarily Sn plated layer and melted. With this method, the high temperature Sn solder, which is inferior in wettability to Cu, can be wettingly extended over the Cu plated layer constituting the main layer, and thereby the surface of the pad can be covered with the Sn solder covering layer at a high covering ratio even if the amount of the application of the solder paste is reduced.

As a result of the foregoing, the construction of the wiring board of the present invention, which is conventionally thought to be impossible, can be realized. The wiring board of this aspect of the present invention is characterized by including a wiring laminated layer portion having a dielectric layer comprised of a polymer material and an alternately laminated conductive layer, a plurality of metal pads disposed on a major surface formed of the dielectric layer of the wiring laminated layer portion, and a solder resist layer disposed on the major surface of the wiring laminated layer portion and having openings for exposing the metal pads, with each of the metal pads comprising a main layer comprised of a Cu plated layer, and an Sn solder covering layer comprised of high temperature Sn solder having a liquid phase line temperature of between about 185° C. and 232° C., the Sn solder covering layer covering the surface of the main layer located in each of the openings of the solder resist layer with an area covering ratio of at least 81% so as to be in contact with the main layer, as well as having a protuberant surface having a maximum thickness at a central position of the opening and a minimum thickness at an inner peripheral edge position thereof, the thickness of the Sn solder covering layer at the central position being smaller than the depth of the corresponding opening.

With respect to the present invention, it is possible, for the first time, to form the Sn solder covering layer on the surface of the main layer comprised of the Cu plated layer with an area covering ratio of at least 81% despite the fact that the Sn solder covering layer employs high temperature Sn solder having poor wettability with respect to Cu, with the Sn solder covering layer having a protuberant shape of a maximum thickness at a central position of the opening and of a minimum thickness at an inner peripheral edge position thereof, and the thickness of the Sn solder covering at the central position being smaller than the depth of the corresponding opening. In other words, the Sn solder covering layer has a shape which can be obtained by wettingly extending in a uniform manner the molten metal on the main surface of the pad and which can be formed to be of an appropriate thickness for the first time.

Considering some specific features thereof, the present invention can achieve, inter alia, the effects described below.

(1) Because each pad surface is covered with the Sn solder covering layer whose Pb content is reduced, more effective environmental protection is afforded, i.e., less Pb will be released into the environment. Further, the Sn solder covering layer, which uniformly covers the pad surface, can be formed even though the high temperature Sn solder has poor wettability with respect to Cu. Accordingly, it is possible to accelerate widespread use of the Sn solder covering layer.

(2) A plurality of the metal pads can be disposed on the rear surface of the wiring board in one of (i) a grid shape and (ii) a zigzag shape, and form ball grid array pads coupled with solder ball members so that the metal pads are connected to terminals of the board. In this case, the surface area that is exposed because it is imperfectly covered with the Sn solder covering layer is greatly reduced, despite the fact that the Pb content of the Sn solder covering layer is reduced, and thereby, the connection strength of a solder ball member can be significantly increased as can the spread of this strength over a connection area.

(3) Because the high temperature Sn solder can be wettingly extended in an effective manner, the pad surface can be uniformly covered with the Sn solder covering layer without increasing the thickness thereof. Accordingly, the thickness of the Sn solder covered layer at the central portion thereof can be made smaller than the depth of the corresponding opening of the solder resist layer, and this greatly improves positioning stability when the solder ball member is placed in the opening of the solder resist layer.

(4) It is also possible to arrange the metal pad on the front surface of the wiring board as a marking pad for optically positioning. However, in the case of the present invention, because the pad surface is covered with the Sn solder covering layer having a good reflectance, the optical detecting accuracy of the marking pad is enhanced.

It is preferable that the Sn solder covering layer be comprised of high temperature Sn solder principally comprised of Sn and having a liquid phase line temperature of between about 190° C. and 232° C. and covering the surface of the main layer located in the opening of the solder resist layer with an area covering ratio of 90% or more, so as to be in contact with the main layer. In particular, it is more preferable that the Sn solder covering layer be comprised of a high temperature Sn solder principally comprised of Sn and having a liquid phase line temperature between about 200° C. and 232° C. and cover the surface of the main layer located in the opening of the solder resist layer with an area covering ratio of 95% or more, so as to be in contact with the main layer. A high temperature Sn solder having a liquid phase line temperature which is 200° C. or more can have a significantly reduced Pb content. For example, all the melting points (liquid phase line temperatures) Ts of the Pb free solder having various compositions set forth in Table 1 of the first mentioned reference cited above are 200° C. or more. Further, the advantages and effects of the paragraphs (1) and (4) discussed can be further enhanced by providing a Sn solder covering layer that covers the surface of the main layer with an area covering ratio of 90% or, more preferably, 95% or more.

Further features and advantages of the present invention will be set forth in, or apparent from, the detailed description of preferred embodiments thereof which follows.

DESCRIPTION OF THE PREFERRED EMBODIMENTS

Figure 3:
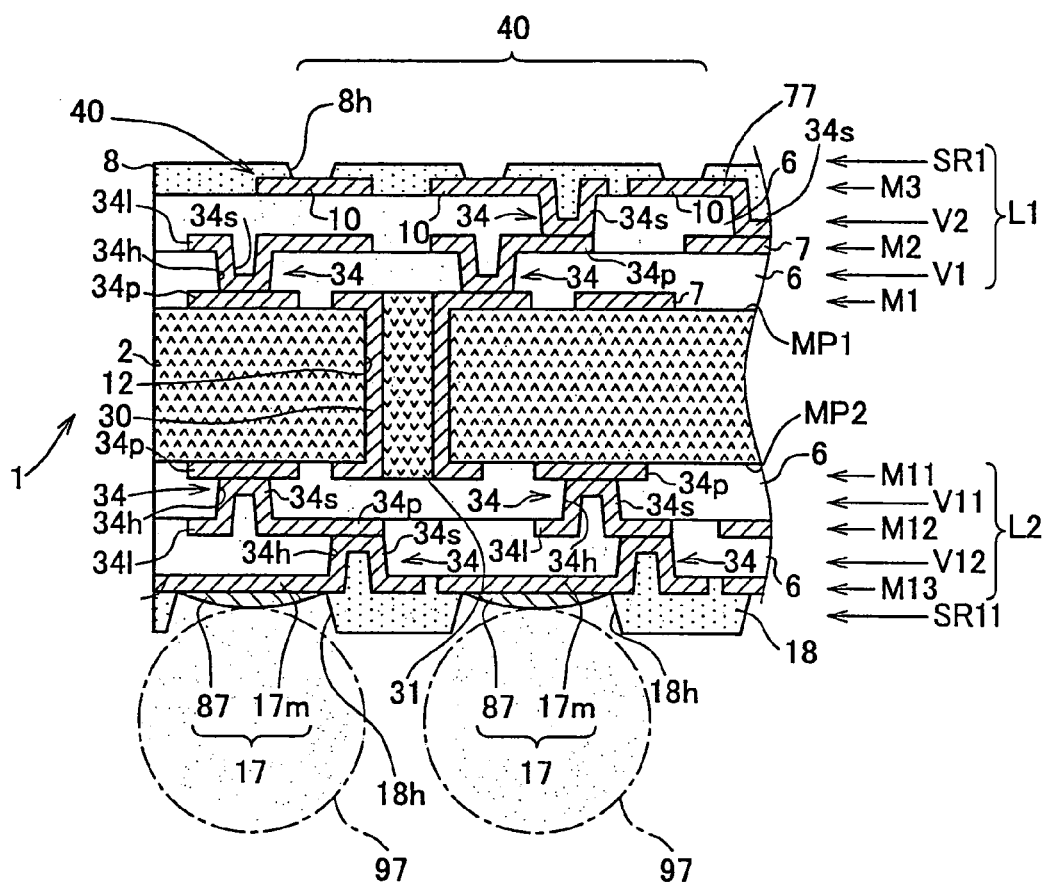
FIG. 3 is a cross-sectional view showing an exemplary cross-sectional construction of a wiring board according to a preferred embodiment of the present invention.

FIG. 3 is a schematic cross-sectional of a wiring board 1 with semiconductor parts in accordance with one embodiment of the present invention. The wiring board 1 includes a planar or a sheet-shaped core 2 comprised of a heat resistant resin sheet (for example, a bismaleimide- triazine resin sheet), a fiber reinforced resin sheet (for example, a glass fiber reinforced epoxy resin sheet), or the like. Core 2 includes core conductive layers M1 and M11 formed on respective sides of the sheet-shaped core 2. Each of the core conductive layers M1 and M11 has a predetermined pattern and acts as a wiring metal layer. Core conductive layers M1 and M11 are formed as surface conductive patterns covering a large portion of the surface of the sheet-formed core 2 and are used as power supply layers or ground layers. Further, the sheet-shaped core 2 includes through holes 12 formed by drilling or the like, and a through hole conductor 30 is formed around the inside wall of each through hole 12 to provide an electrical conductive connection between the core conductive layers M1 and M11. In addition, the through hole 12 is filled with a resin filler material 31 such as an epoxy resin, or the like.

First via layers (also referred to as "built-up" layers or dielectric layers) V1 and V11, each comprised of a light sensitive resin component 6, are formed on the core conductive layers M1 and M11, respectively. Further, first conductive layers M2 and M12, each comprising a metal wiring 7, are formed on the surfaces of the first via layers V1 and V11 by, e.g., plating Cu thereon. It is noted that the core conductive layers M1 and M11 are connected to the first conductive layers M2 and M12, respectively, through interlayer connections provided by vias 34.

Similarly, second via layers (also referred to as built-up layers or dielectric layers) V2 and V12, comprised of a similar light sensitive resin component 6, are formed on the first conductive layers M2 and M12, respectively.

Second conductive layers M3 and M13, having metal terminal pads 8 and 18, are formed on the surfaces of the second via layers V2 and V12. The first conductive layers M2 and M12 are connected to the second conductive layers M3 and M13, respectively, through interlayer connections provided by vias 34.

As shown in FIG. 3, each via 34 includes a via hole 34$h$, a via conductor 34$s$ disposed around the inner periphery thereof, a via pad 34$p$ disposed so as to provide an electrical connection with the via conductor 34$s$ on a bottom side, and a via pad 34$l$ extending externally from the peripheral edge of the opening of the via conductor 34$h$ on a side opposite to the via pad 34$p$.

The core conductive layer M1, the first via layer V1, the first conductive layer M2, and the second via layers V2 form a first wiring laminated layer portion L1 on a first main surface MP1 of the sheet-shaped core 2. Similarly, the core conductive layer M11, the first via layer V11, the first conductive layer M12, and the second via layers V12 form a second wiring laminated portion layer L2 on a second main surface MP2 of the sheet-shaped core 2.

In all of the first and second wiring laminated layer portions L1 and L2, the dielectric and conductive layers are alternately laminated together so that a dielectric layer 6 is formed on each on an outer surface thereof, and a plurality of metal terminal pads 10 and 17 are formed on each of the main layers, respectively. The metal terminal pads 10 on the first wiring integrated layer portion L1 constitute solder pads as pads for "flip chip" connection of laminated circuit parts, and the like.

Figure 1:
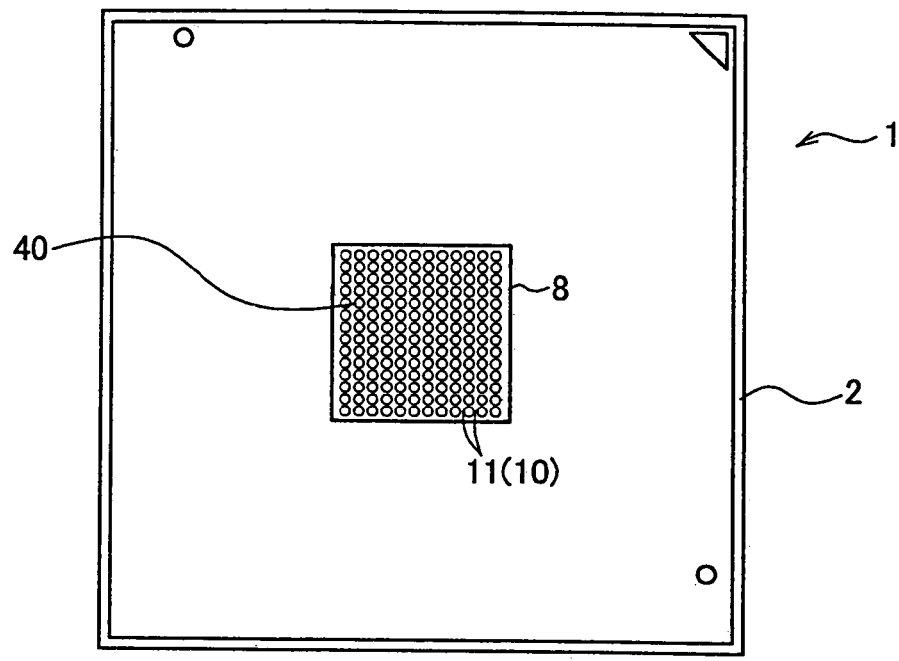
FIG. 1 is a top plan view showing an embodiment of a wiring board.
Figure 2:
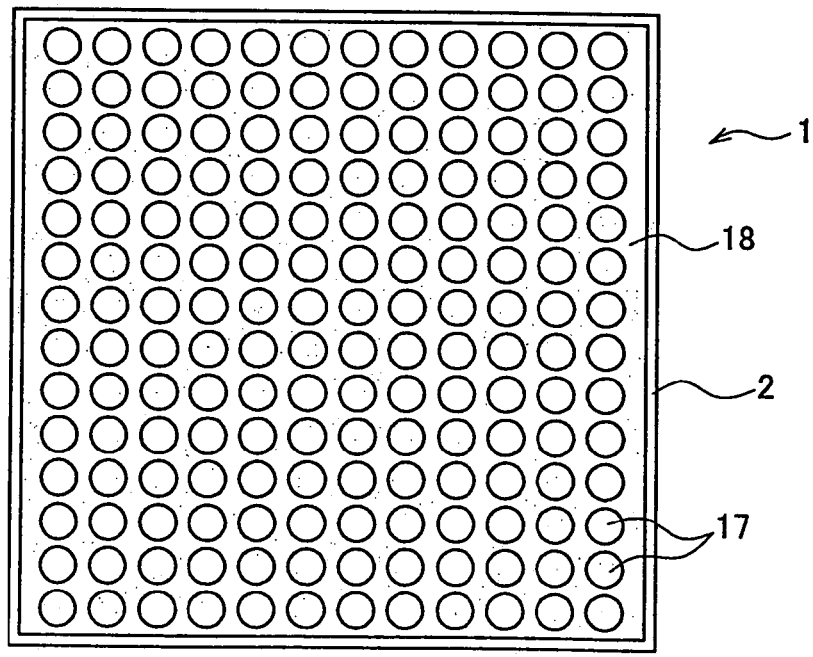
FIG. 2 is a bottom plan view of the embodiment of the wiring board shown in FIG. 1.

The metal terminal pads 17 on the second wiring laminated layer portion L2 are used as rear side pads for connecting the wiring board itself to a mother board, or the like, through ball grid arrays (BGAs). As shown in FIG. 2, the second side pads 17 in the second conductive layer M13 are also disposed, and formed, in a grid shape. A solder resist layer 8 and 18 (also identified as SR1 and SR11), each comprised of a light sensitive resin component, are formed on the second conductive layers M3 and M13, respectively. The solder resist layers 8 and 18 have openings 8$h$ and 18$h$ formed therein which correspond to, and are aligned with, the respective first or second side pads 10 and 17 so as to expose the latter.

The via layers V1, V11, V2, and V12, and the solder resist layers 8 and 18 are produced, in accordance with an exemplary embodiment, as will now be described. Light sensitive adhesive films formed of a light sensitive resin component varnish are laminated (bonded) to each other and exposed to light through a transparent mask (for example, a glass mask) having patterns corresponding to the via holes 34$h$ and overlapped thereon. The portions of the film other than the via holes 34$h$ are cured by exposure to light, whereas the portions of the via holes 34$h$ remain as they are in a non-cured state. Accordingly, the via holes 34$h$ having predetermined patterns can be formed simply by dissolving the portions of the via holes 34$h$ with a solvent and thus eliminating these portions (using the so-called "photovia" process).

In FIG. 3, the second side pads 17 are metal pads (and hereinafter, are also referred to as the metal pads 17). The metal pads 17 are disposed in the grid shape shown in FIG. 2 (or in a zigzag shape) and solder ball members 97 are coupled therewith as shown in dashed lines in FIG. 3.

Figure 4:
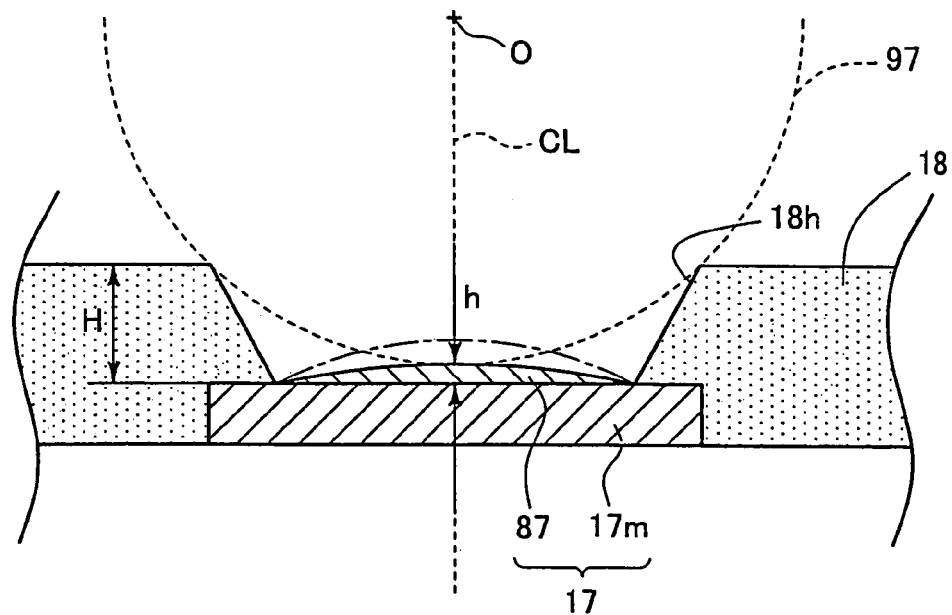
FIG. 4 is a schematic cross-sectional view, drawn to an enlarged scale, showing a portion of wiring board construction on a BGA pad side.

FIG. 4 shows the metal pad 17 in more detail and in an inverted position relative to FIG. 3. The metal pad 17 includes a main layer 17$m$ comprised of a Cu plated layer and an Sn solder covering layer 87 comprised of a high temperature Sn solder whose liquid phase line temperature lies in the range between about 185° C. and 232° C. (and preferably between 190° C. and 232° C., more preferably between 195° C. and 232° C., and most preferably between 200° C. and 232° C.). The Sn solder covering layer 87 covers the surface of the main layer 17$m$ located in the opening 18$h$ of the solder resist layer 18 with an area covering ratio of at least 81% (preferably at least 85%, more preferably at least 90%, and even more preferably at least 95%, although an even higher area covering ratio is most preferable) so as to come in contact with the main layer 17$m$. The Sn solder covering layer 87 is formed so as to have a protuberant surface, wherein the thickness of layer 87 is maximum at a central position of the opening 18$h$ and a minimum at the inner peripheral edge thereof. Further, the thickness, h, of layer 87 at the central position is smaller than the depth, H, of the corresponding opening 18$h$. It is noted that the material of the solder ball member 97 is also a high temperature Sn solder.

The high temperature Sn solder constituting the Sn solder covering layer 87 will be considered in more detail. Although a simple Sn metal corresponds to a metal obtained by simply eliminating all the Pb from a eutectic solder, it is difficult to employ such a simple Sn metal as substitute solder because the simple solder has the melting point of 232° C. and this is about 50° C. higher than that of the eutectic solder. In this case, a candidate high temperature Sn solder is selected from those which are mainly comprised of Sn (which contain at least 62 wt % Sn in the eutectic solder as described above,) and whose main eutectic forming component is other than Pb. When the intent is to use a solder element based on a Sn alloy whose Pb content is greatly reduced from that of Sn—Pb eutectic solder, it is necessary that the solder element be made of high temperature solder whose melting point is at least 185° C. (and in particular, at least 200° C., with an upper limit of 232° C. which is the melting point of simple Sn). It is preferable because of environmental concerns that the Pb content of the high temperature Sn solder be no greater than 5 wt % (and more preferably, 1 wt % or less, and even more preferably that the Pb content be as small as possible apart from the Pb inevitably contained in associated impurities).

The requirements of an accessory ingredient added to the high temperature Sn solder include the following: the cost thereof should be low, the additive amount should be small even if the cost thereof is somewhat high, and the accessory ingredient should have excellent soldering properties and flow properties, good corrosion resistance, and the like. In addition, the accessory ingredient should reduce the melting point of the final composition as much as possible.

Contrary to what might be expected, accessory ingredients meeting the foregoing requirements in a balanced way are limited to a relatively few elements such as Zn, Bi, Ag and Cu, among others.

For example, a Sn—Zn system has an eutectic point in the vicinity of 15 wt % Zn and the melting point of the composition can be lowered to about 195° C. However, since Zn has relatively poor corrosion resistance, the additive amount of Zn is ordinarily limited to about 7–10 wt %. Further, when a two-component material is used in the composition, the resultant melting point is lowered only to about 215° C. Accordingly, although the melting point can be adjusted by adding 1–5 wt % of Bi, it is difficult to obtain a melting point less than 200° C. Further, Bi is expensive as well as disadvantageous insofar as there is no guaranteed or stable supply because Bi is a strategic material.

Considering others of the candidate elements, Ag and Cu have a melting point substantially higher than that of Sn as a simple element. However, a Sn—Ag system has an eutectic point in the vicinity of 5 wt % Ag, while a Sn—Cu system has an eutectic point in the vicinity of 2 wt % Cu on a Sn rich side. Further, with respect to the use of Ag, the Ag—Cu system is also an eutectic system and the resultant melting point can be significantly lowered using a ternary eutectic of Sn—Ag—Cu. However, since the binary eutectic temperature of the Sn—Ag system and the Sn—Cu system is about 220° C., it is impossible to lower the resultant melting point to 200° C. or less even if a ternary eutectic system is employed.

Since the Sn content of the Sn solder covering layer 87 is between about 94 wt % and 99 wt %, it is preferable from the viewpoint of lowering the melting point that the Sn solder covered layer 87 use a high temperature Sn solder containing between about 1 wt % and 6 wt % of one or both of Ag and Cu as an eutectic forming the accessory ingredient. For example, in an Sn—Ag alloy, an Ag content of from 3 wt % to 6 wt % with respect to Sn is a recommended composition from the viewpoint of lowering the melting point. Likewise, in an Sn—Cu alloy, a Cu content of between 1 wt % and 3 wt % with respect to Sn is preferred. Further, in an Sn—Ag—Cu alloy, a preferred Ag and Cu content is between 3 wt % and 6 wt %, and a preferred weight ratio of Cu to (Ag+Cu) is between 0.1 and 0.5. In any of these cases, the melting point of the solder is 200° C. or more.

Figure 5:
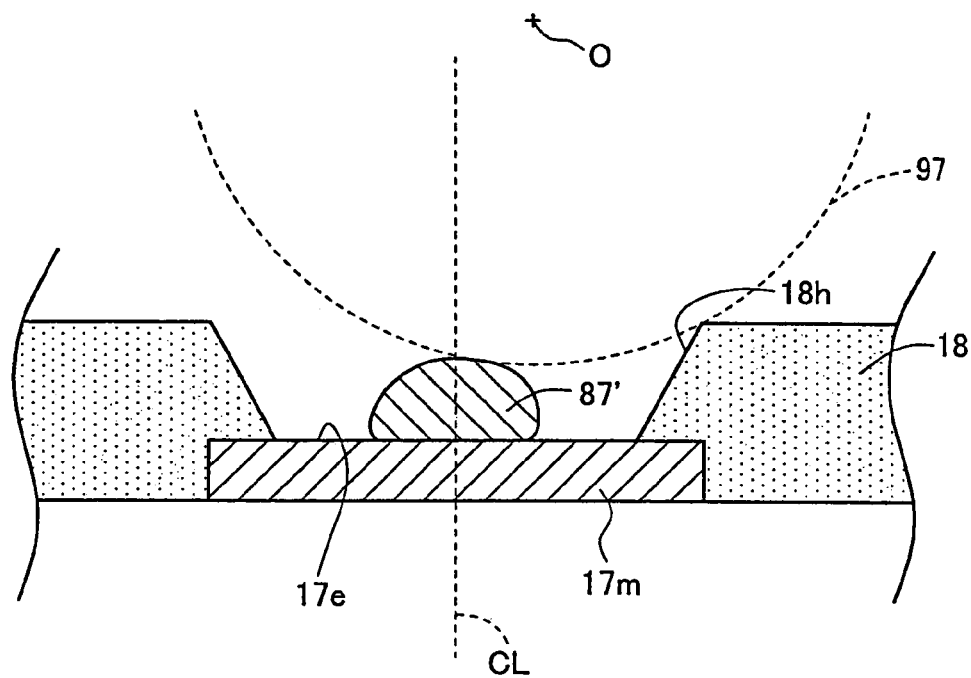
FIG. 5 is a schematic cross-sectional view, drawn to an enlarged scale, showing a portion of wiring board construction providing a comparative example with respect to the construction shown in FIG. 4.

In a preferred embodiment of the present invention, the Sn solder covering layer 87 comprises such a high temperature Sn solder must be formed on the surface of the main layer 17m of the pad of the Cu plated layer exposed to the solder resist layer 18. As shown in FIG. 5, even if the intent is to melt and form the Sn solder covering layer 87' by directly applying a solder paste on the surface of the main layer 17m, which is comprised of the Cu plated layer, and by then allowing the solder paste to reflow, the high temperature Sn solder does not wettingly cover well, because the solder has a high reflow temperature and has a poor wettability with respect to Cu. As a result, a large area of exposed surface 17e remains. This is disadvantageous because the strength of the connection to the solder ball 97 is weakened. Further, since quite a large amount of solder 87' swells high on the main layer 17m without wettingly extending over the surface thereof, when the solder ball 97 is placed on solder 87 and mounted on layer 17m, the solder ball 97 is unstable on the pad 17. Further, a positioning accuracy of ball 97 on pad 17 is poor.

Figure 6A:
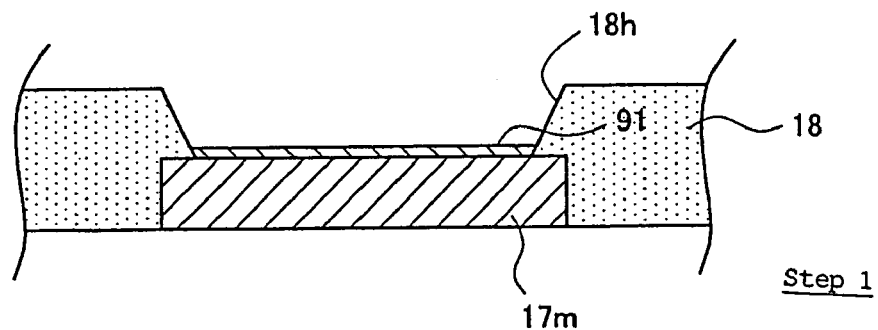
FIGS. 6(a) to 6(c) are cross-sectional views showing three steps in a process for producing the wiring board of the present invention.
Figure 6A:
Figure 6B:
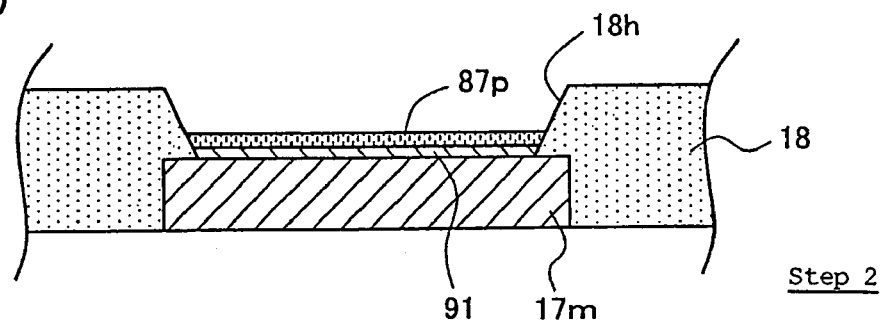
Figure 6B:
Figure 6C:
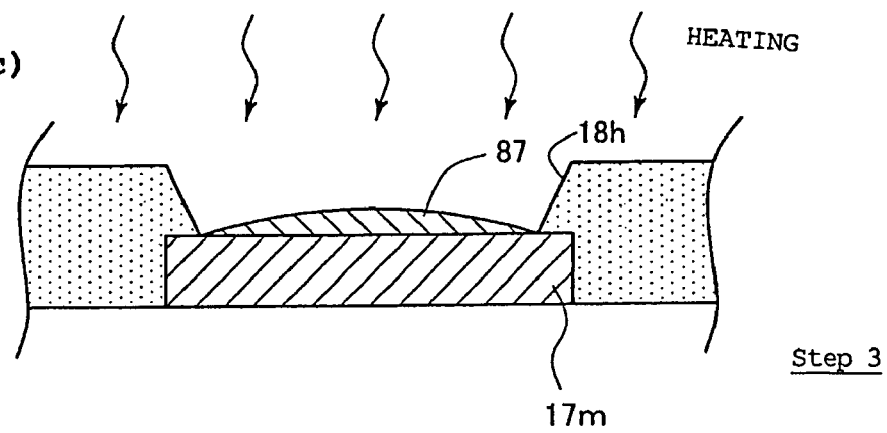

To cope with and overcome the above-discussed problems, the present invention employs a process shown in FIGS. 6(a) to 6(c). First, as shown in FIG. 2(a) in a first step, step 1, the solder resist layer 18 is formed such that the main layer 17m of the metal pad 17 is exposed in the opening 18h, and the surface of the exposed main layer 17m is covered with a preliminarily Sn plated layer 91 by non-electrolysis or electrolysis plating Sn. (This is referred to herein as a preliminary plating step.)

Next, as shown in FIG. 6(b), in step 2, s solder paste layer 87p, including a solder powder comprised of a high temperature Sn solder, is applied on the preliminarily Sn plated layer 91, the paste having a thickness greater than that of the preliminarily Sn plated layer 91. (This is referred to herein as solder paste application process.)

Then, as shown in FIG. 6(c), in step 3, the above-mentioned Sn solder covering layer 87 is formed by heating the applied solder paste layer 87p, which covers the surface of the preliminarily Sn plated layer 91 on the main layer 17m, to a temperature higher than the liquid phase line temperature of the high temperature Sn solder so that the applied solder paste layer 87p is melted together with the preliminarily Sn plated layer 91 and the melted layers together wettingly extend over the surface of the main layer 17m. (This is referred to as the solder melting step.)

It will be understood from the foregoing that the solder paste layer 87p comprised of the high temperature Sn solder is not directly applied to the surface of the main layer 17m of the pad, and that the preliminarily Sn plated layer 91 is thinly formed on the surface of the main layer 17m before the solder paste layer 87p is applied, and thereafter the solder paste layer 87p is applied on the preliminarily heated Sn layer 91 and melted. With the above method, the high temperature Sn solder, which does not have as good wettability with respect to Cu, can be caused to wettingly extend over and cover the Cu plated layer constituting the main layer 17m. As a consequence, the surface of the pad can be covered with the Sn solder covered layer 87 with a high covering ratio even if the amount of the applied solder paste 87p of the foregoing technique is reduced.

As a result of the foregoing, the amount of a pad surface which is imperfectly covered with the Sn solder covering layer 87, and thus exposed is greatly reduced regardless of the fact that the Pb content of the Sn solder covered layer 87 is greatly reduced. Consequently, the connection strength of the connection to a solder ball member is significantly increased, as is the extension of this increased strength over a wider area. Further, since the high temperature Sn solder wettingly extends over a substantially increased area, the pad surface can be uniformly covered with the Sn solder covering layer 87 without increasing the thickness of that layer. Accordingly, the thickness h of the Sn solder covering layer 87 at a central portion thereof can be made smaller than the depth H of the opening 18h of the solder resist layer 18, and this greatly improves positioning stability when the solder ball member is placed in the opening 18h of the solder resist layer 18.

With the techniques described above, it is very easy to cover the surface of the main layer 17m in the opening 18h with the Sn solder covering layer 87 at an area ratio of 95% or more while also satisfying h<H requirement. Moreover, it is possible to obtain a covering at an area ration of 98% or more, and almost 100% in some cases. It will be apparent that this amount of covering is substantially greater than that provided by a conventional method (for example, 80% or less) as shown in FIG. 5, and there is also a substantial improvement in connection strength, and reliability and positioning accuracy when the solder ball 97 is connected.

In an important embodiment, the preliminarily plated Sn layer 91 preferably has a thickness of between 0.9 $\mu$m and 5.0 $\mu$m. When the thickness of the preliminarily plated Sn layer 91 is less than 0.9 $\mu$m, it is difficult to uniformly cover the surface of the main layer 17m with the preliminarily plated Sn layer 91 and thus the resultant covering ratio of the Sn solder covering layer 87 may be insufficient. On the other hand, when the thickness of the preliminarily plated Sn layer 91 is 5.0 $\mu$m or more, the time taken by the plating step is increased and production efficiency is decreased.

It is preferable to form the preliminarily plated Sn layer 91 as a composition having a Sn content of 95 wt % or more in order to sufficiently improve the wettingly covering property of the Sn solder covering layer 87, i.e., the ability of layer 87 to wettingly cover the pad. In this regard, it is advantageous to use a preliminarily plated Sn layer 91 containing Au as an accessory ingredient so as to increase the affinity between the main layer 17m comprised of the Cu plated layer and the preliminarily plated Sn layer 91 and to further improve the wettingly covering property of the Sn solder covering layer 87. When the Au content of the preliminarily plated Sn layer 91 is less than 0.1 wt %, the Au is less effective in providing these advantages, whereas when the Au content exceeds 5 wt %, the amount of Au—Sn intermetal compound formed is increased, thereby lowering the connection strength of the connection to the solder ball 97.

In a BGA pad, the diameter of the region in the opening 18h on the surface of the metal pads 17 is ordinarily set at between to 200 $\mu$m and 600 $\mu$m. In this case, the Sn solder covering layer 87 is suitably formed in a thickness of between 10 $\mu$m and 20 $\mu$m at a central position. The thickness of the solder paste applied layer 87p is adjusted such that the thickness of the finally obtained Sn solder covering layer 87 is between 10 $\mu$m and 20 $\mu$m at the central position. These limits are important because when the thickness of the Sn solder covering layer 87 is set to less than 10 $\mu$m at the central position, it is difficult to uniformly cover the surface of the metal pad 17 with the Sn solder covering layer 87. Further, when the thickness of the Sn solder covering layer 87 exceeds 20 $\mu$m at the central position, it is difficult to provide the thickness h which is smaller than the depth H of the opening of the solder resist layer 18 (the depth H being between 10 $\mu$m and 35 $\mu$m) ordinarily used in the BGA pad, and thus the positioning accuracy of the solder ball 97 may suffer. The thickness h is preferably chosen to be one half of the depth H of the opening, or less.

The Sn solder covering layer 87 formed by applying and melting the solder paste can be formed so as to have an approximately spherical surface shape by employing the production method of the present invention. In this case, it is preferable to form the Sn solder covering layer 87 in the shape of a spherical segment having a bottom surface determined by the surface of the main layer 17m and a front surface whose radius of curvature is between 260 $\mu$m and 4000 $\mu$m. This range is important in that when the radius of curvature of the front surface is set at a value exceeding 4000 $\mu$m, the thickness of the Sn solder covering layer 87 becomes excessively thin. Accordingly, it is difficult to uniformly cover the surface of the metal pad 17 with the Sn solder covering layer 87. On the other hand, when the radius of curvature of the front surface is less than 260 $\mu$m, the thickness h of the Sn solder covering layer 87 becomes excessively large at the central position, and thus the positioning accuracy of the solder ball 97 may suffer.

It is noted that it is also possible to form a pad structure similar to the metal pad 17 on the flip chip connection side of the wiring board and to use this pad as a marking pad formed on the surface of the wiring board in determining optical positioning. In this case, although no solder ball is connected to the pad, the optical detection accuracy of the pad can be increased because the surface of the pad is covered with the Sn solder covering layer and the latter has good reflectance.

Figure 7:
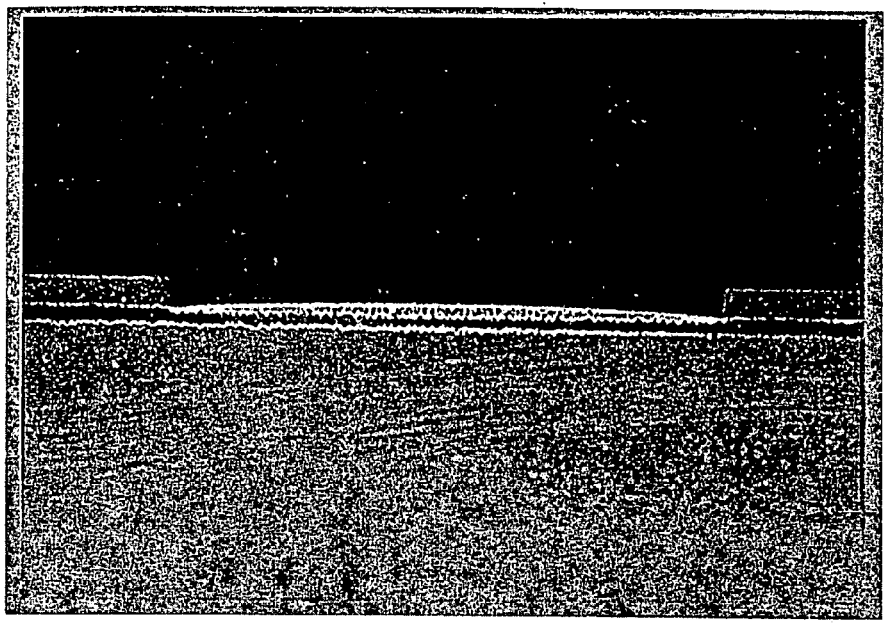
FIG. 7 shows a cross sectional image of an actual example of a structure, on the BGA pad side, according to the present invention, when observed under an optical microscope.

FIG. 7 shows an image of the cross section of an Sn solder covering layer observed under an optical microscope, In FIG. 7, the Sn solder covering layer is obtained by forming an Sn plated layer, having a composition of Sn-1 wt % Au and a thickness of about 1 $\mu$m, as a preliminary Sn plated layer to a solder resist layer opening having a diameter of 250 $\mu$m and a depth H of 25 $\mu$m, on a main layer composed of a Cu plated layer Ag—Cu solder by non-electrolysis plating, and further applying a Sn—Ag—Cu solder paste (having a composition of Sn-3 wt % Ag-0.5 wt % Cu) to a thickness of 40 $\mu$m and subjecting the same to reflow at 252° C. The surface of the main layer in the opening is covered with an approximately 100% Sn solder covering layer having a thickness h of about 10 $\mu$m at a central position.

Figure 8:
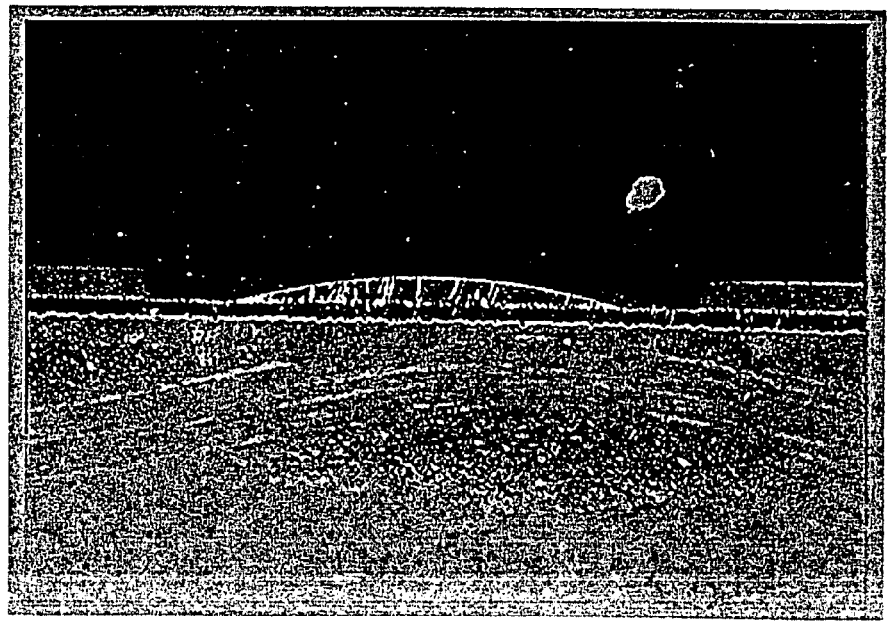
FIG. 8 shows a cross sectional image of an actual example of a structure, on the BGA pad side, according to a comparative example, when observed under an optical microscope.

In contrast to FIG. 7, FIG. 8 shows the cross section of a Sn solder covering layer provided as a comparative example and also observed under the optical microscope, the Sn solder covering layer being formed without the preliminary Sn plated layer. The main layer located in the opening has a relatively small surface covering ratio of 70% and a thickness of about 35 $\mu$m at a central position. It was also determined that the Sn solder covering layer swells approximately as high as the depth, H, of the opening, with the attendant disadvantages described above.

Although the invention has been described above in relation to preferred embodiments thereof, it will be understood by those skilled in the art that variations and modifications can be effected in these preferred embodiments without departing from the scope and spirit of the invention.

What is claimed:

1. A method of producing a wiring board comprising a wiring laminated layer portion having a dielectric layer comprised of a polymer material and an alternately laminated conductive layer, a plurality of metal pads disposed on a major surface of the dielectric layer of the wiring laminated layer portion, and a solder resist layer disposed on the major surface of the wiring laminated layer portion and having openings therein exposing the metal pads, wherein each of the metal pads comprises a main layer, comprised of a Cu plated layer, and a Sn solder covering layer, comprised of high temperature Sn solder essentially comprised of Sn and having a liquid phase line temperature of between 185° C. and 232° C., the Sn solder covering layer covering the surface of the main layer located in each of the openings of the solder resist layer at an area covering ratio of at least about 81% so as to be in contact with the main layer and having a protuberant surface with a maximum thickness at a central position of the opening and a minimum thickness at an inner peripheral edge position thereof, and the thickness of the protuberant surface at the central position being smaller than the depth of the corresponding opening, the method comprising the following steps executed in the following order:

- a preliminary plating step of forming the solder resist layer such that a surface of the main layer of each metal pad is exposed in a corresponding opening, and covering the exposed surface of the main layer with a preliminary Sn plated layer;
- a solder paste application step of applying a solder paste, containing solder powder comprised of the high temperature Sn solder and thicker than the preliminary Sn plated layer, on the preliminary Sn plated layer; and
- a solder melting step of forming the Sn solder covering layer by melting the applied solder paste together with the preliminary Sn plated layer, by heating the applied solder paste to a temperature higher than the liquid phase line temperature of the high temperature Sn solder, and thereby wettingly extending the Sn solder covering layer over the surface of the main layer.

2. A method of producing a wiring board according to claim 1, wherein the Sn solder covering layer comprises high temperature Sn solder principally comprised of Sn and having a liquid phase line temperature of between about 200° C. and 232° C. and covering the surface of the main layer located in the opening of the solder resist layer with an area covering ratio of at least 95% so as to be in contact with the main layer.

3. A method of producing a wiring board according to claim 1, wherein the preliminary Sn plated layer is formed so as to have a thickness of between about 0.9 μm and 1.8 μm.

4. A method of producing a wiring board according to claim 1, wherein the preliminary Sn plated layer is formed so as to have a composition containing at least 95 wt % of Sn.

5. A method of producing a wiring board according to claim 4, wherein the preliminary Sn plated layer used in the method contains Au as an accessory ingredient.

6. A method of producing a wiring board according to claim 5, wherein the Au content of the preliminary Sn plated layer is between about 0.1% and 5 wt %.

7. A method of producing a wiring board according to claim 1, wherein the thickness of the solder paste applied layer is adjusted such that the thickness of a finally obtained Sn solder covering layer is between about 10 μm and 20 μm at the central position.

8. A wiring board comprising a wiring laminated layer portion having a dielectric layer comprised of a polymer material and an alternately laminated conductive layer, a plurality of metal pads disposed on a major surface formed of the dielectric layer of the wiring laminated layer portion, and a solder resist layer disposed on the major surface of the wiring laminated layer portion and having openings for exposing the metal pads, each of the metal pads comprising a main layer, comprised of a Cu plated layer, and a Sn solder covering layer comprised of a high temperature Sn solder principally comprised of Sn and having a liquid phase line temperature of between about 185° C. and 232° C., the Sn solder covering layer covering a surface of the main layer located in each of the openings of the solder resist layer with an area covering ratio of at least 81% so as to be in contact with the main layer and having a protuberant shape having a maximum thickness at a central position of the opening and a minimum thickness at an inner peripheral edge position thereof, the thickness of the Sn covering layer at the central position being smaller than the depth of the corresponding opening.

9. A wiring board according to claim 8, wherein the Sn solder covering layer comprises high temperature Sn solder principally comprised of Sn and having a liquid phase line temperature of between about 200° C. and 232° C. and covers the surface of the main layer located in the opening of the solder resist layer at an area covering ratio of at least 95% so as to be in contact with the main layer.

10. A wiring board according to claim 8, wherein the Sn solder covering layer comprises a high temperature Sn solder whose Sn content is between about 94 wt % and 99 wt % and which contains between about 1 wt % and 6 wt % of one or both of Ag and Cu as an eutectic forming accessory ingredient.

11. A wiring board according to claim 8, wherein the thickness of the Sn solder covering layer is between about 10 μm and 20 μm at the central position and the diameter of the region of the surface of the metal pad located in the opening is between about 200 μm and 600 μm.

12. A wiring board according to claim 11, wherein the Sn solder covering layer of a spherical segment shape having a bottom surface defined by the surface of the main layer and a front surface having a radius of curvature between about 260 μm and 4000 μm.

13. A wiring board according to claim 8, wherein a plurality of the metal pads are disposed on the rear side of the wiring board in one of a grid shape and a zigzag shape and form ball grid array pads coupled with solder ball members so that the metal pads are connected to terminals of the board.

* * * * *